United States Patent [19]

Lewis

[11] Patent Number: 4,521,779
[45] Date of Patent: Jun. 4, 1985

[54] PULSE COMPRESSION SYSTEM
[75] Inventor: Bernard L. Lewis, Oxon Hill, Md.
[73] Assignee: The United States of America as represented by the Secretary of the Navy, Washington, D.C.
[21] Appl. No.: 143,399
[22] Filed: Apr. 24, 1980
[51] Int. Cl.³ .................. G01S 7/30; G01S 13/52
[52] U.S. Cl. .................. 343/17.2 PC; 343/7.7
[58] Field of Search .................. 343/17.2 PC, 7.7; 364/517

[56] References Cited

U.S. PATENT DOCUMENTS

| | | | |
|---|---|---|---|
| 3,631,490 | 12/1971 | Palmier | 343/7.7 |
| 3,747,099 | 7/1973 | Wong | 343/17.2 PC |
| 4,035,799 | 7/1977 | Hsiao | 343/7.7 |
| 4,119,962 | 10/1978 | Lewis | 343/7.7 |
| 4,119,963 | 10/1978 | Zwarts et al. | 343/17.2 PC |
| 4,137,532 | 1/1979 | Taylor, Jr. et al. | 343/7.7 |
| 4,167,737 | 9/1979 | Freedman | 343/17.2 PC |
| 4,204,165 | 5/1980 | Ready | 343/17.2 PC X |
| 4,217,584 | 8/1980 | Lombardi et al. | 343/7.7 |
| 4,237,461 | 12/1980 | Cantrell et al. | 343/17.2 PC X |

Primary Examiner—Sal Cangialosi
Assistant Examiner—John B. Sotomayor
Attorney, Agent, or Firm—Robert F. Beers; William T. Ellis; Alan P. Klein

[57] ABSTRACT

A system for polyphase encoding transmitted pulses of energy and for decoding the received signals to enhance returns from the range interval being examined during a particular processing period and attenuate returns from contiguous range intervals (pulse compression). The system includes a decoding device which comprises a delay circuit having N distributed outputs including its input for producing a uniform delay between adjacent outputs corresponding to N inputted elements of a received phase-coded signal of length $N^2$; a conjugator circuit coupled to the first N/2 successive outputs of the delay circuit; a first signal-combining circuit coupled to the conjugator circuit and to the last N/2 successive outputs of the delay circuit; a multiplier circuit coupled to the first signal-combining circuit; and a second signal-combining circuit coupled to the multiplier circuit. The decoding device provides a decoding phase shift $-\Delta\phi_{k,p}$ to the signal elements of the phase-coded signal wherein $$\Delta\phi_{k,p} = -(2\pi/N)[k-(\tfrac{1}{2})(N-1)][p-(\tfrac{1}{2})(N-1)]$$

is the phase of the pth code element in the kth subgroup and $k=0,1,2,\ldots,N-1$ and $p=0,1,2,\ldots,N-1$, with N an even integer, and thereafter adds the phase-shifted signal elements at the same time to produce a narrow pulse with an accompanying increase in effective peak signal.

10 Claims, 15 Drawing Figures

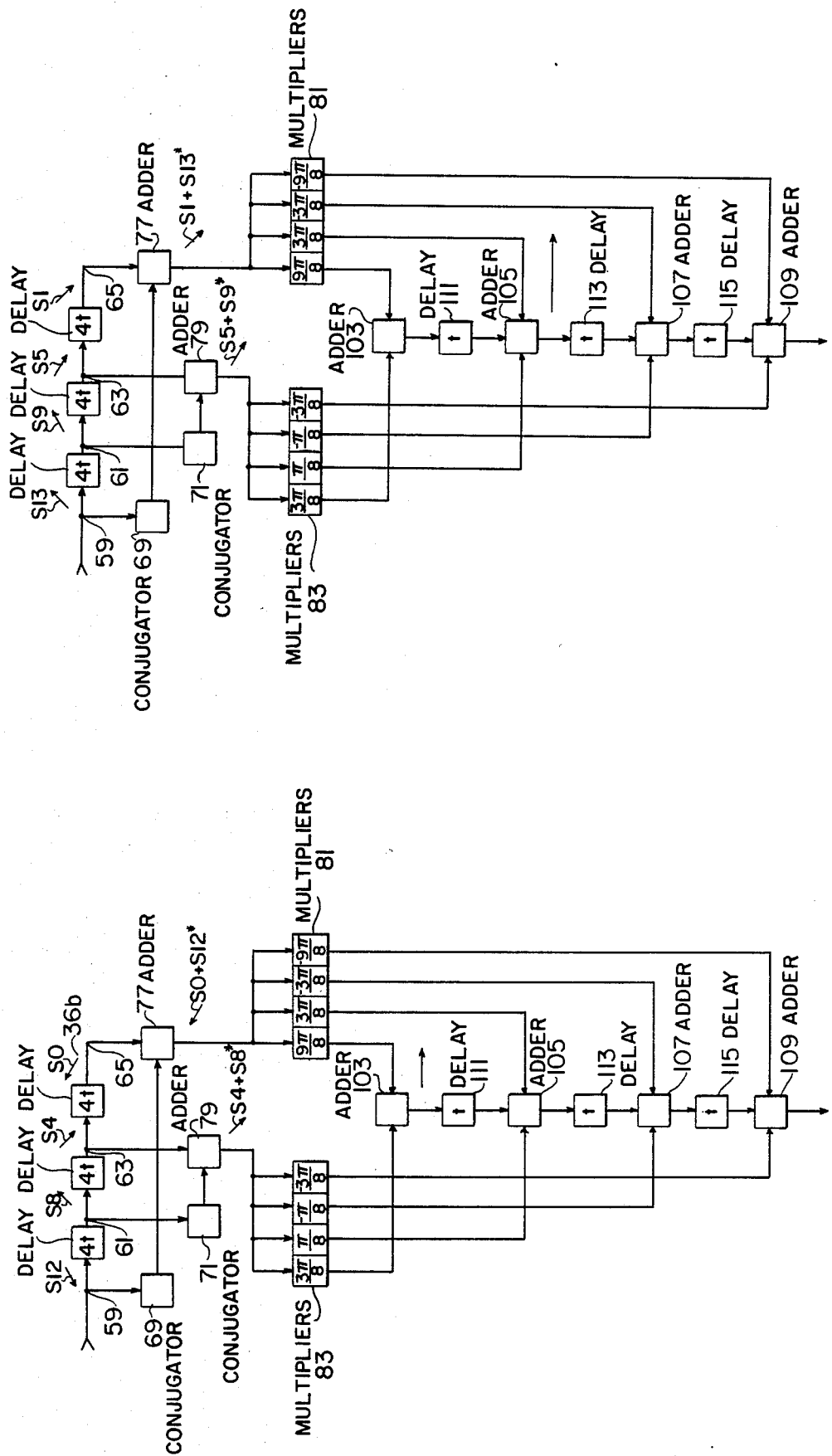

PULSE COMPRESSION SYSTEM

BACKGROUND OF THE INVENTION

This invention relates generally to polyphase code systems and more particularly to digital systems having reduced complexity for coding and decoding sequences of polyphase encoded signals.

In applications such as radar mapping and ranging, it is theoretically possible to achieve any desired range resolution by transmitting a sufficiently narrow pulse of energy and then processing the received energy in a receiver unit of suitable bandwidth. Following this approach, as the pulsewidth decreases the peak power of the transmitted signal must be increased if a given range capability is to be maintained. For many applications the combined range and range resolution requirements would require a transmitted narrow pulse of such peak power as to exceed the current voltage breakdown in transmission lines and antennas.

The above-described problem prompted the development of pulse compression techniques wherein a fairly long (time duration) low peak power encoded pulse is transmitted, and on reception the received signal is decoded (time compressed).

A discussion, including a full bibliography of phase-coded pulse compression techniques and the selection of optimum coding is provided at pages 428-32 of "Introduction to Radar Systems" 2nd. Ed. by Skolnik published by McGraw-Hill (1980).

Prior art digital decoding systems for encoded signals employ pseudo-random binary or polyphase codes such as the Frank code that do not have mirror symmetry between the first and last half of the code. As a consequence, the decoding systems require many components.

SUMMARY OF THE INVENTION

It is therefore an object of this invention to digitally compress long coded pulses to short pulses of optimum signal-to-noise ratio.

It is another object of this invention to provide optimum compression with a minimum amount of circuitry.

Briefly described, the subject invention involves a decoding device for a pulse compression system wherein the phase-coded elements associated with a signal reflected from a reflector are decoded by subjecting them to a phase rotation equal in magnitude but opposite in direction to that imposed upon the transmitted signal, after which the signal elements are added at the same time to produce a narrow pulse with an accompanying increase in effective signal peak power. The complexity of the decoding device is reduced by employing a novel Butler matrix code having mirror symmetry between the first and last half of the code subgroups. The code symmetry permits the first and last half of the received signal elements to be decoded by the same circuitry, after the latter are passed through a set of conjugators.

Additional advantages and features will become apparent as the subject invention becomes better understood by reference to the following detailed description when considered in conjunction with the accompanying drawings wherein:

BRIEF DESCRIPTION OF THE DRAWINGS

FIGS. 7a, 7b, 7c, 7d and 7e comprise a block diagram of a preferred embodiment of a decoding device included in the receiver of FIG. 6 and a decoding sequence for the signals from reflector b of FIG. 1.

DESCRIPTION OF THE PREFERRED EMBODIMENT

The subject invention may be better understood by first discussing polyphase code techniques and a pulse compression application requiring the decoding of consecutive groups of encoded signals.

Figure 1:
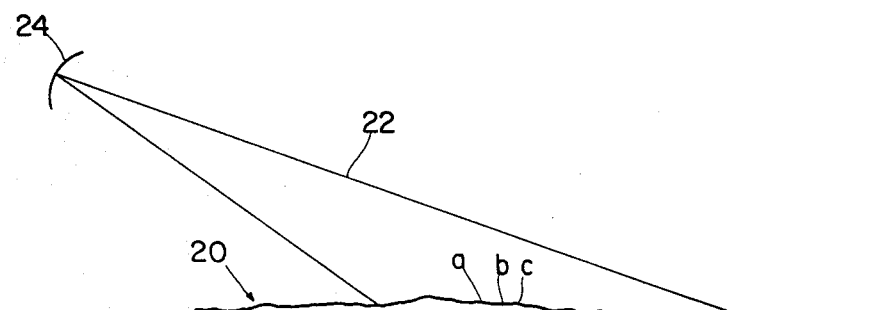
FIG. 1 depicts a group of discrete closely spaced reflectors within the radiation beam of the transmission system of the subject invention and is useful in the explanation of the operation of the invention.
Figure 2:
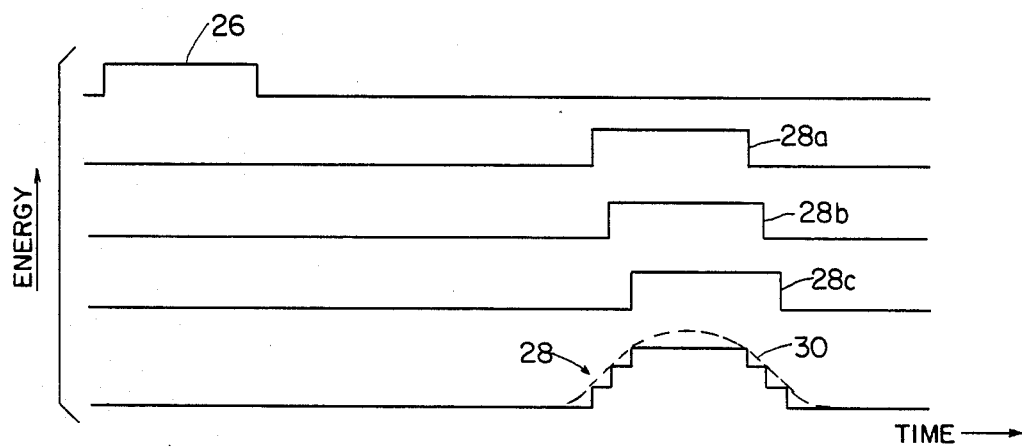
FIG. 2 shows waveforms of a transmitted signal pulse, received signals from each of the reflectors of FIG. 1, and a composite signal received from the three reflectors.

FIG. 1 shows in greatly simplified terms one such application wherein the terrain 20 includes closely spaced reflector elements a, b and c within the pattern 22 of an antenna 24. If it is assumed that the transmitted energy pulse is as shown by a waveform 26 in FIG. 2, waveforms 28a, 28b and 28c of FIG. 2 show the return signal from the the reflectors of FIG. 1 designated by the same letter; and waveform 28 the composite received video signal. Dashed line 30 depicts the shape of signal 28 after processing by a receiver of limited bandwidth and as may be seen from envelope 30 the range and number of the individual reflectors could not be determined simply from the amplitude of the composite signal 28.

Figure 3:
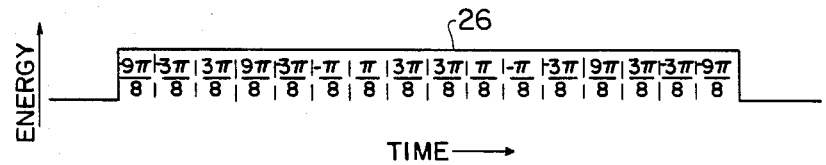
FIG. 3 depicts the relative phase shift within a transmitted pulse for a simplified code of four encoded states and 16 elements.

If the transmitted pulse 26 were first phase encoded ith a suitable code, range resolution could be greatly enhanced and by way of example the transmitted pulse 26 is shown at an expanded time scale in FIG. 3 as encoded by a novel "Butler matrix" code having 16 phase states and 16 encoded elements. The "Butler matrix" code will be discussed in greater detail hereinafter. The phase (in radians) encoded on each of the elements within pulse 26 is indicated in the FIG. 3 and may be determined from the matrix of Table 1 as read from left to right progressing from the top to the bottom row.

TABLE I

| | | Code Element (p) | | | |
|---|---|---|---|---|---|
| | | 0 | 1 | 2 | 3 |
| Code Subgroup (K) | 0 | $\frac{-9\pi}{8}$ | $\frac{-3\pi}{8}$ | $\frac{3\pi}{8}$ | $\frac{9\pi}{8}$ |
| | 1 | $\frac{-3\pi}{8}$ | $\frac{-\pi}{8}$ | $\frac{\pi}{8}$ | $\frac{3\pi}{8}$ |

TABLE I-continued

| | Code Element (p) | | | |
|---|---|---|---|---|
| | 0 | 1 | 2 | 3 |
| 2 | $\frac{3\pi}{8}$ | $\frac{\pi}{8}$ | $\frac{-\pi}{8}$ | $\frac{-3\pi}{8}$ |
| 3 | $\frac{9\pi}{8}$ | $\frac{3\pi}{8}$ | $\frac{-3\pi}{8}$ | $\frac{-9\pi}{8}$ |

Figure 4:
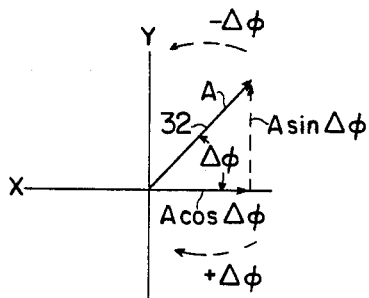
FIG. 4 is a vector diagram for explaining the vectorial symbology adapted herein.

Before further proceeding with the explanation of the pulse compression application, the vector symbology adapted herein will first be explained with reference to FIG. 4. The relative phase of the transmitted energy contained within pulse 26 may be represented by vector 32 of length A referenced to an XY coordinate system. The coordinate system (X,Y) is assumed to rotate at an angular frequency $f_0$, equal to the fundamental frequency of the transmitted pulse.

A phase shift $\Delta\phi$ in the transmitted signal relative to the fundamental frequency $f_0$ is shown by the angle between the X axis and the vector; and the vector may be defined by the magnitude of the inphase component along the X axis (A cos $\Delta\phi$) and the imaginary component (A sin $\Delta\phi$) along the Y axis. Sometimes hereinafter such a vector is designated by the notation A cos $\Delta\phi + j$ A sin $\Delta\phi$. As indicated in FIG. 4, a clockwise phase rotation has arbitrarily been assigned a positive value while a counterclockwise rotation (phase delay) is designated a negative value. A phase advance of X degrees may be mechanized by phase delay of $2\pi - X$ degrees.

To properly decode a transmitted pulse such as pulse 26 (FIG. 3) a phase rotation equal to but opposite to the phase encoded during transmission is impressed on the received signal (multiplication by the complex conjugate of the encoded value, i.e., multiplication by the complex quantity (cos $\Delta\phi - j$ sin $\Delta\phi$). For example, in complex notation, a phase shift of 45° may be mechanized by a multiplication by the complex quantity $(1+j)/\sqrt{2}$. To decode a signal element which had been encoded by the just mentioned 45° phase shift would require multiplication by the complex conjugate of the encoding function, i.e., $(1-j)/\sqrt{2}$. If the received signal 28 were applied to a shift register such that all the signal elements of the signal reflected from one of the reflectors, such as the reflector b for example, were contained within the shift register then the range interval corresponding to the area containing the reflector b could be examined by providing the appropriate decoding phase shift.

Figure 5A:
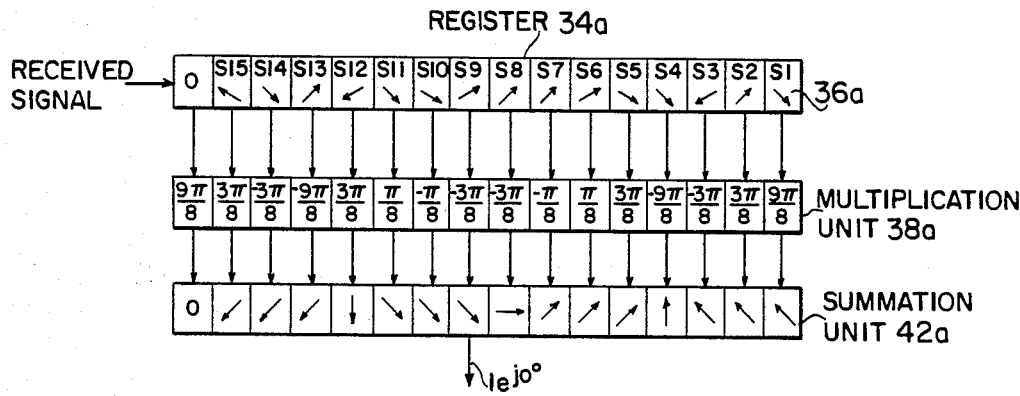
FIGS. 5a, 5b and 5c illustrate a simplified decoding sequence for the signals from each of the reflectors of FIG. 1 for the purpose of assisting in the visualization of the pulse compression effect derived from polyphase encoded signals.
Figure 5B:
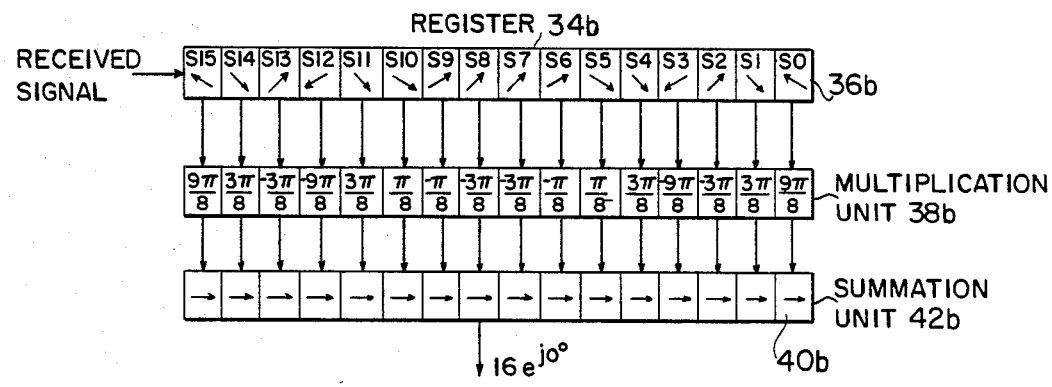
Figure 5C:
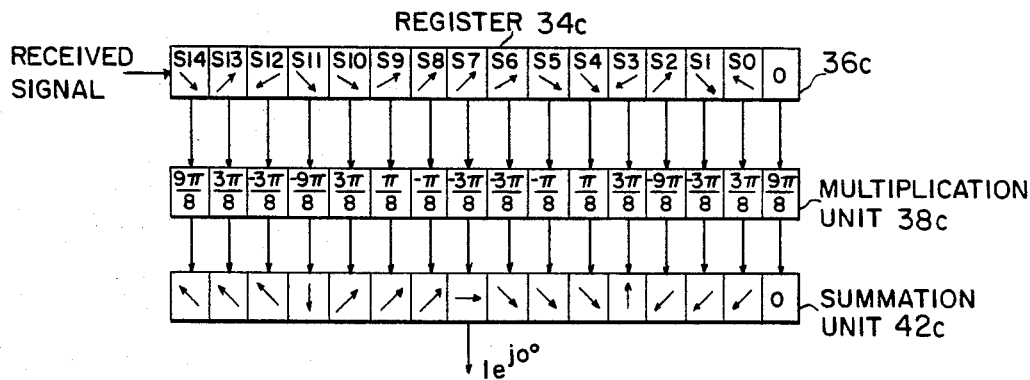

This decoding process may be visualized by referring to FIG. 5a, 5b and 5c wherein each of the returned signals 28a, 28b and 28c respectively are decoded as though they were separately processed. If it is assumed that the signals are processed in a linear manner prior to the decoding step an analysis of each signal separately and a combination of results thereof is indicative of the results of the simultaneous processing of the signals (Superposition Theorem). It is assumed that the signal elements of the received signal 28 are shifted into 16 shift registers 34a, 34b and 34c so that the signal elements associated with each reflector are stored within the correspondingly labeled register. If it is further assumed that at the time of a particular observation the last return element from reflector b had been just received, it may be shown that by proper decoding the received energy from reflector b is enhanced while the energy from reflectors a and c is attenuated. In FIGS. 5a–5c the received signal components are illustrated as being separately processed in registers 34a–34c, multiplication units 38a–38c and summers 42a–42c corresponding to the component signal from the respective reflector designated by the same letter—it being understood that in actuality one unit simultaneously processes the composite signal 28.

The signal elements $S_0$ through $S_{15}$ associated with reflector b are shown in FIG. 5b as being stored in the register 34b. The relative phase of each received signal element is indicated by vector arrows such as arrow 36b. To decode the signal group contained in the register 34b, a phase rotation equal in magnitude but opposite in direction to that impressed upon the transmitted signal is required. This phase rotation may be produced in a complex multiplication unit 38b which produces the phase shift indicated therein which is opposite to the phase shift impressed on transmitted signal 26. Complex multiplication units will be described in detail subsequently during the explanation of the decoder unit of FIG. 7.

The output of the multiplication unit 38b (phase indicated by arrows such as 40b) is applied to a complex summation unit 42b and the sum produced by this unit is indicated at the output thereof as a vector with an amplitude 16 times that of each element of the signal 28b and at a relative phase angle of zero ($16e^{j0}$).

It will be noted in FIGS. 5a, 5b and 5c that each element of the same stage (rank) of shift register 34 receives the same phase rotation in the multiplier units 38a–38c. However, the signals associated with reflectors a and c are at a different relative position in the registers and are decorrelated whereas the signals from the reflector b are centered in the register and are correlated. In regard to this last point, it will be noted that in register 34a the signal element $S_0$ (the first return from reflector a at a time t=0) has been shifted out of the register and the entire code is one position to the right of the corresponding elements in register 34b with no energy in position 16, in register 34a. Similarly the code elements in the register 34c are each shifted one position to the left of the elements of the register 34b. As indicated by the sum values at the outputs of the summation networks 42, the reflected energy from the range interval being correlated (reflector b) is enhanced and the energy value from the adjacent uncorrelated range intervals (a and c) are substantially attenuated.

The present invention employs a novel code for pulse compression applications that is derivable from a Butler matrix used to steer array antennas. (See, for example, U.S. Pat. No. 3,255,450 issued to J. L. Butler on June 7, 1966). This code, which may be readily encoded onto the transmitted signal and can provide adequate range resolution comprises $N^2$ discrete phase states with a code length of $N^2$ (where N is an even number). The phase encoded on each of the elements within pulse 26 for the general case of $N^2$ encoded elements may be determined from the formula $$\Delta\phi_{k,p} = -(2\pi/N)[K-(\tfrac{1}{2})(N-1)][p-(\tfrac{1}{2})(N-1)]$$

where $$k = 0, 1, 2, \ldots, N-1$$

and $$p = 0, 1, 2, \ldots, N-1.$$

$\Delta\phi_{k,p}$ is the phase of the pth code element in the kth code subgroup. The code matrix, by way of example for $N=4$, is illustrated in Table I. The code has mirror symmetry between the first and last half of the code subgroups, specifically $$-\Delta\phi_{(N-1)-k',p} = \Delta\phi_{k',p}$$

By way of example, for $N=4$, the negative of the phase encoded on signal element $S_{12}$, i.e. $-\Delta\phi_{3,0} = -9\pi/8$ is the phase encoded on signal element $S_0$, i.e. $\Delta\phi_{0,0}$. If the relative phase of the transmitted energy contained within signal element $S_{12}$ is represented by a vector 32 of length A as in FIG. 4, $(9\pi/8)$ is the angle in radians between the X axis and the vector. The vector 32 representing the relative phase of the transmitted energy within signal element $S_0$ will have an angle $(-9\pi/8)$ in radians between the X axis and the vector. If the vector 32 for signal element $S_{12}$ is designated by the rotation A cos $(9\pi/8)+j$ A sin $(9\pi/8)$, the vector 32 for signal element $S_0$ is just the complex conjugate of that for signal element $S_{12}$. As will be shown hereinafter, this mirror symmetry of the Butler matrix code can be exploited to reduce the complexity of its implementation.

The decoding function may be mechanized as discussed relative to FIGS. 5(a)–(c) by first multiplying each signal element of a particular group by the specified phase rotation and then adding each of the phase rotated signals. For digital mechanization this approach would require $N^2$ complex multiplications and $N^2$ complex additions. Since each group of received signal elements corresponds to only one range interval for a typical radar application of $2^{10}$ range intervals, for example, $2^{14}$ or 16,384 complex multiplications and 16,384 complex additions would be required each transmission period for the relatively simple code having $N^2=16$ discrete phase states. Also, the mechanization of the above mentioned technique would require a shift register having $N^2$ output terminals. In microminiature circuits the number of required output leads is a significant factor in determining the size and economy of the device, and a design which significantly reduces the number of output taps would enjoy an economic advantage due to that feature alone.

As will now be developed, the required number of complex multiplications and complex additions is substantially reduced by exploiting the symmetrical nature of the Butler matrix code.

Prior to a detailed description of one preferred embodiment of a decoding device in accordance with the subject invention, a radar system suitable for transmitting a polyphase encoded signal in accordance with the invention and for receiving and processing the reflected video signal groups in accordance with the invention will first be described.

Figure 6:
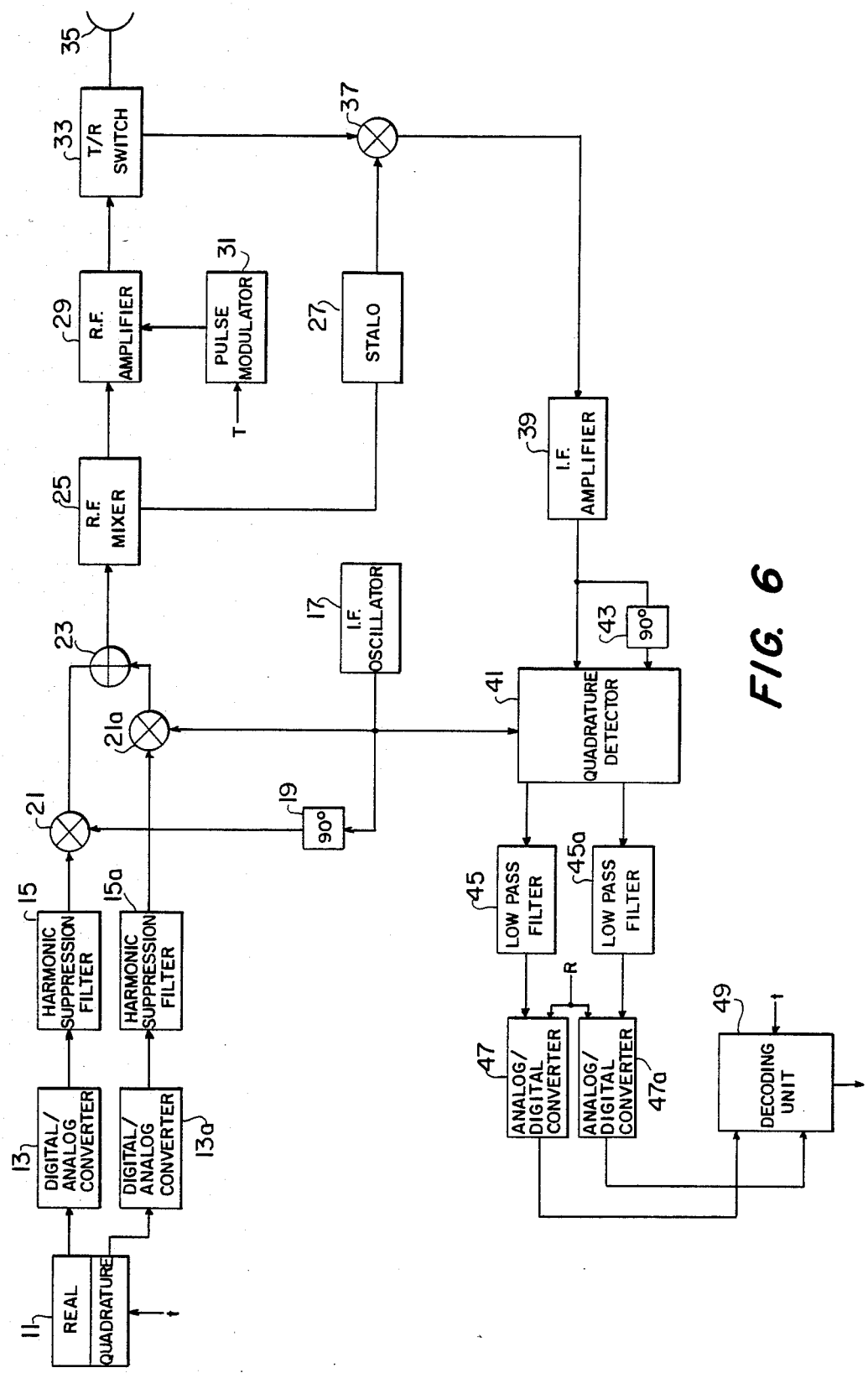
FIG. 6 is a block diagram of a system for transmitting a polyphase encoded signal and of a receiver for processing the received reflected energy in accordance with the principles of the invention.

Referring now to FIG. 6 which shows the transmission and receiving portions of such a radar system, a conventional read only memory 11 is programmed to produce in digital form, the real and the quadrature, or imaginary, coefficients of the modulation signal of the transmitted waveform. If the relative phase of the transmitted energy contained within the waveform is represented by a vector of length A with a phase shift $\Delta\phi$ relative to the fundamental frequency $f_0$ of the transmitted pulse (as illustrated in FIG. 4), then for a code of $N^2=16$ phase states, for example, the real coefficients of the modulation signal will comprise 16 values of A cos $\Delta\phi$ and the imaginary coefficient of the modulation signal will comprise 16 values of A sin $\Delta\phi$. The read only memory 11 is activated by gated clocking pulses, t, from a conventional synchronizer (not shown). Such gated clocking pulses are applied to the read only memory 11 for a period of time equal to $N^2$ times the clock pulse period to generate the uncompressed pulse for transmission. The digital signals out of the read only memory 11 are passed to a pair of digital to analog converters 13, 13a. These elements are conventional and identical. The output signal from each digital to analog converter 13, 13a, is an analog signal, each such signal being the baseband signal representative of a quadrature component of the desired modulation signal. The quadrature components of the desired modulation signal are combined and impressed on a carrier signal in a single sideband generator after passing through harmonic suppression filters 15, 15a. In this process, the signal out of harmonic suppression filter 15 is mixed with the output signals of an IF oscillator 17 (after the latter output signal is passed through a 90° phase shifter 19), in a balanced mixer 21. Similarly, the output signal of harmonic suppression filter 15a is mixed with the output signal of the IF amplifier 17 in balanced mixer 21a. The resulting signals from mixer 21 and mixer 21a are then added in an analog adder 23. The signal out of adder 23 is then impressed, by means of an RF mixer 25, on the output signal of a stable local oscillator, STALO 27, to produce a low power modulated RF signal. The latter signal is passed through an RF amplifier 29 (which is pulsed by way of a pulse modulator 31 in synchronism with the transmit gate, T) via a T/R switch 33 to a directional antenna 35.

Energy reflected from targets (not shown) illuminated by the modulated RF energy transmitted from the directional antenna 35, passes therethrough to the T/R switch 33 to a mixer 37. The second input to the mixer 37 is the output signal from the STALO 27. It follows, therefore, that the carrier frequency of the difference signal from the mixer 37 is the same as the frequency from the IF oscillator 17, modulated in the same way as the transmitted RF signal and including any Doppler shift due to target motion. Such IF signal then is passed through a conventional IF amplifier 39 and a quadrature detector 41, one input to the latter being shifted in phase by 90° in a 90° phase shifter 43. Quadrature phase shifter 41 is preferably made up of a pair of balanced mixers (not shown) similar to balanced mixers 21, 21a. The outputs of the quadrature detector 41, which are baseband signals, are passed through low pass filters 45, 45a to a pair of analog to digital converters 47, 47a. Each of the analog to digital converters 47, 47a is actuated during the receive gate, R interval to sample the analog signal from one of the low pass filters 45, 45a and convert such samples back into the same digital format as the format of the signals out of the read only memory 11. The digital words representative of the digital value of the inphase and quadrature signals (i.e., the values of A cos $\Delta\phi$ and A sin $\Delta\phi$ defining the vectors that represent the relative phases of the signal elements of the received signal) are applied from the converters to decoding device 49 which is actuated by the gated blocking pulses t.

Figure 7A:
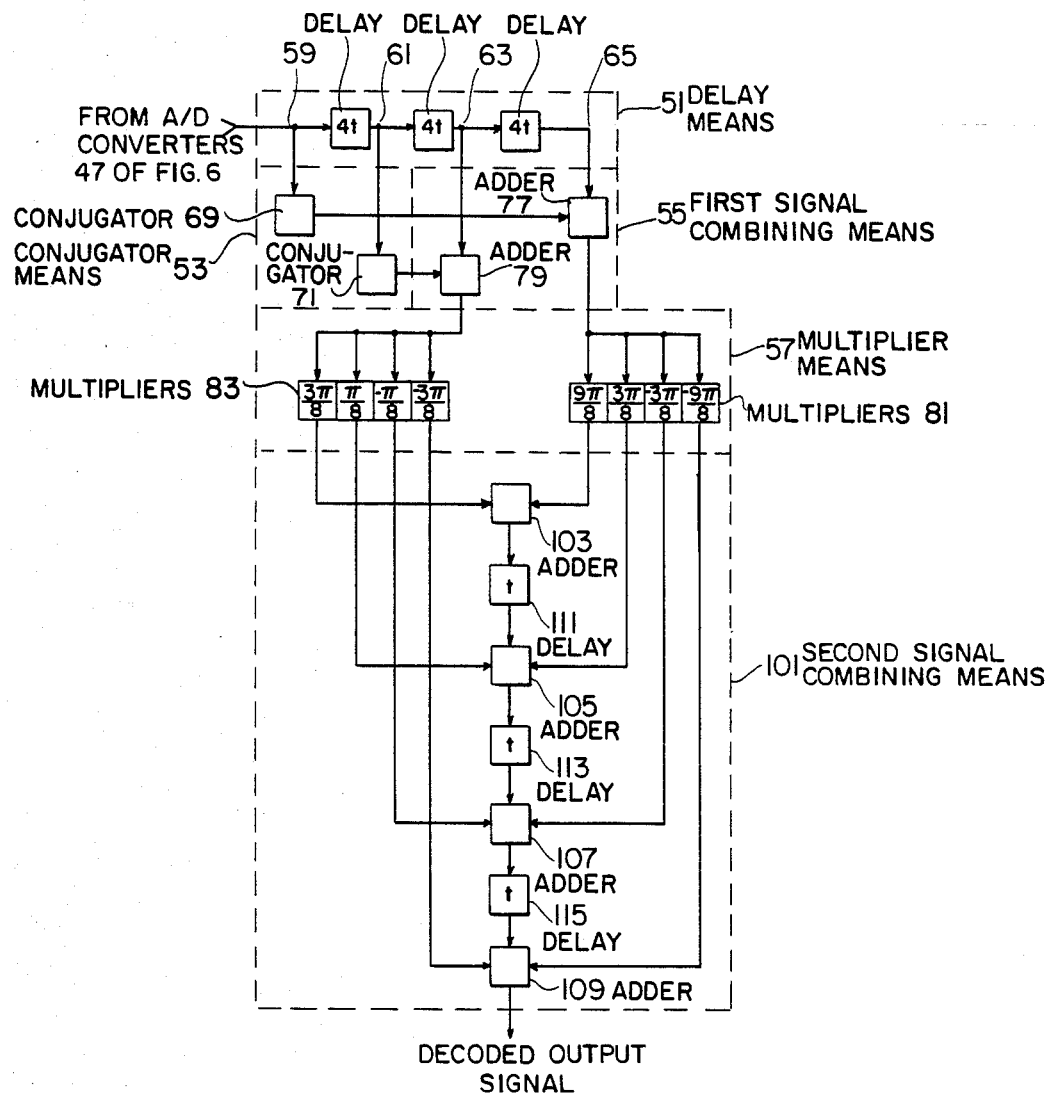

One preferred embodiment of the decoding device 49 which exhibits the aforementioned advantages of reliability and reduction in the number of arithmetic operations is shown in block diagram in FIG. 7a. All of the elements shown in FIG. 7a are dual parallel channel devices for separately processing the inphase and quadrature signals and all of the converting leads are composite leads (for example, comprising 16 individual leads with eight for each inphase and each quadrature word respectively).

The decoding unit 49 comprises means for providing a decoding phase shift $-\Delta\phi_{k,p}$ to the signal elements of the received signal, and means for adding the phase-shifter signal elements at the same time to produce a narrow pulse with an accompanying increase in effective peak signal. While the phase-shift providing means may take a variety of forms, conveniently it may take the form illustrated of delay means 51, conjugator means 53, first signal combining means 55, and multiplier means 57.

Delay means 51 has N distributed outputs, 59, 61, 63, and 65 including the input terminal (N=4 in the illustrated embodiment) for producing a uniform delay between adjacent ones of successive outputs corresponding to N inputted signal elements. Delay means 51 may comprise, for example, ($N^2-N$) stages of a dual channel shift register with output terminals every Nth stage and at the input.

Conjugator means 53 is coupled to the first N/2 successive outputs 59 and 61 of the delay means 51 for producing the complex conjugate of the corresponding signal elements. Conjugator means 53, may, for example, comprise N/2 complex conjugators 69 and 71 coupled respectively to the first N/2 successive outputs 59 and 61 of the delay means 51.

Figure 8:
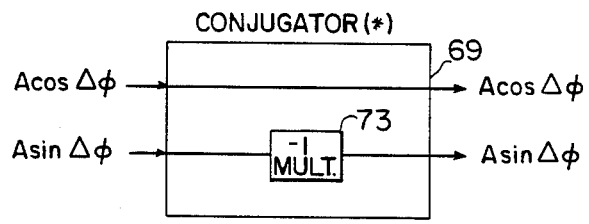
FIG. 8 is a block diagram of a conjugator.

The details of conjugator 69 are shown in FIG. 8. The inphase (A cos $\Delta\phi$) and quadrature (A sin $\Delta\phi$) components are fed into the conjugator. The inphase component passes directly through the conjugator while the quadrature (i.e., imaginary) component is multiplied by $-1$ in multiplier 73 and fed out as ($-$A sin $\Delta\phi$). The output of the conjugator is (A cos $\Delta\phi-$jA sin $\Delta\phi$) which is the conjugate of (A cos $\Delta\phi+$jA sin $\Delta\phi$).

Referring back to FIG. 7a, first signal combining means 55 is coupled to the conjugator means 53 and to the last N/2 successive outputs 63 and 65 of the delay means 51 for combining outputs thereof having the same complex phase angle. First signal combining means 55 may comprise, for example, N/2 complex adders 77 and 79 coupled respectively to the N/2 conjugators 69 and 71 and to the last N/2 successive outputs 65 and 63 of the delay means. Complex adders 77 and 79 may comprise dual channel conventional full adders with one channel processing the inphase term and the other channel the quadrature term.

Multiplier means 57 is coupled to the first signal combining means 55 for impressing a phase rotation upon each output of the signal combining means equal in magnitude but opposite in direction to the complex phase angle thereof to decode the signal elements of the phase-coded signal. Multiplier means 57 may comprise, for example, N/2 groups of complex multipliers, 81 and 83 coupled respectively to the N/2 complex adders 77 and 79. In the illustrated embodiment for which N=4, group 81 includes four complex multipliers respectively providing a phase shift $$\Delta\phi' = -\Delta\phi_{0,p} \equiv (3\pi/4)(p-3/2)$$

where p=0, 1, 2, 3. Group 83 includes four complex multipliers respectively providing a phase shift $$\Delta\phi' = -\Delta\phi_{1,p} \equiv (\pi/4)(p-3/2)$$

where p=0, 1, 2, 3. The phase shift $\Delta\phi'$ (in radians) produced by each complex multiplier in FIG. 7 is indicated in the box representing the complex multiplier.

Figure 9:
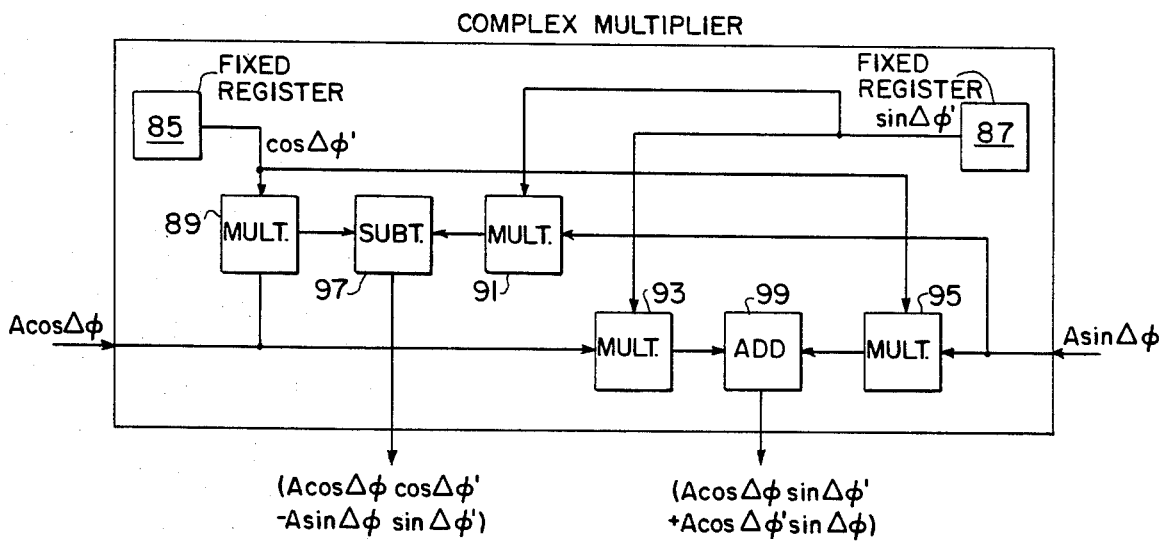
FIG. 9 is a block diagram of a complex multiplier.

The details of the complex multipliers are shown in FIG. 9. Each complex multiplier forms the vector product of a vector quantity designated by the notation (cos $\Delta\phi'+$j sin$\Delta\phi'$) stored in inphase and quadrature, fixed content registers 85 and 87 with a vector quantity supplied from complex adder 77 or 79 in order to mechanize a phase shift of the latter vector quantity by $\Delta\phi'$. The operation of the complex multiplier may be explained by first recalling that the product of two complex numbers (cos $\Delta\phi'+$j sin $\Delta\phi'$) and (A cos $\Delta\phi+$j A sin $\Delta\phi$), is (A cos $\Delta\phi$ cos $\Delta\phi'-$A sin $\Delta\phi$ sin $\Delta\phi'$)+j (A cos $\Delta\phi$ sin $\Delta\phi'+$A cos $\Delta\phi'$ sin $\Delta\phi$). Cos $\Delta\phi'$ and sin $\Delta\phi'$ are the inphase and quadrature terms of the vector quantity stored in fixed content registers 85 and 87. Real multipliers 89 and 91, which may be conventional digital multipliers, form the terms A cos $\Delta\phi$ cos $\Delta\phi'$ and A sin $\Delta\phi$ sin $\Delta\phi'$ respectively and the latter term is substracted from the former term in a substractor 97 to form the inphase term of the complex product. Similarly, real multipliers 93 and 95 form the terms A cos $\Delta\phi$ cos $\Delta\phi'$ and A cos $\Delta\phi'$ sin $\Delta\phi$ respectively and these terms are combined in adder 99 to form the quadrature term of the complex product.

While the means for adding the phase-shifted signal elements at the same time may take a variety of forms, conveniently it may take the form illustrated in FIG. 7a of a second signal combining means 101 coupled to the multiplier means 57 for combining the outputs thereof. Second signal combining means 101 may comprise, for example, N complex adders 103, 105, 107, 109 respectively coupled to one complex multiplier from each group 81 and 83, and N$-$1 delay means 111, 113 and 115 interconnecting the N complex adders for respectively introducing a delay corresponding to one inputted signal element. Delay means 111, 113 and 115 may comprise, for example, single stage dual-channel shift registers. The output of the decoding unit 49 is taken from the last unit 109 of the N complex adders.

The decoding process may be visualized by referring to 7b, 7c, 7d and 7e wherein the returned signals 28b associated with reflector b in FIG. 1 is decoded. The signal elements $S_0$ through $S_{15}$ associated with reflector b are shown being shifted down delay means 51. The relative phase of each signal element appearing at the output 59, 61, 63 or 65 of delay means 51 is indicated by a vector arrow such as arrow 36b. To decode the four signal elements the mirror symmetry of the code is exploited.

Referring to FIG. 7b, it is assumed that at the time of the particular observation, the 12th return element from reflector b has just been received (for a code of N=4). Signal elements $S_{12}$ and $S_8$ are conjugated in complex conjugators 69 and 71 and added in complex adders 77 and 79 to signal elements $S_0$ and $S_4$ respectively to produce two vectors with amplitudes 2 times that of each element. (Recall that the negative of the phase encoded on signal element $S_{12}$ is the phase encoded on signal element $S_0$, for example, so that the vector 32 for signal element $S_0$ is just the complex conjugate of that for signal element $S_{12}$). The outputs of complex adders 77 and 79 are applied to the two groups of complex multipliers 81 and 83 which produce the phase shifts indicated therein. The two complex multipliers designated $9\pi/8$ and $3\pi/8$ produce phase shifts which are equal in magnitude but opposite in direction to the phase shifts impressed on signal elements $S_0$ and $S_4$ respectively. The outputs of the latter complex multipliers are applied to the first complex adder 103 and the sum produced by this unit is indicated at its output by a vector with an amplitude 4 times that of each element of the signal 28b and at a relative phase angle of zero ($4e^{j0}$).

Referring to FIG. 7c, it is assumed that at the time of the particular observation, the 13th return element from reflector b has just been received. Signal elements $S_{13}$ and $S_9$ are conjugated in complex conjugators 69 and 71 and added in complex adders 77 and 79 to signal elements $S_1$ and $S_5$ respectively to produce two vectors with amplitudes 2 times that of each element. The outputs of complex adders 77 and 79 are applied to the two groups of complex multipliers 81 and 83, and the two complex multipliers designated $3\pi/8$ and $\pi/8$ produce phase shifts which are equal in magnitude but opposite in direction to the phase shifts impressed on signal elements $S_1$ and $S_5$ respectively. The outputs of the latter complex multipliers are applied to the second complex adder 105 and the sum produced by this unit is added to the time-delayed vector inputted by delay means 111 from the first complex adder 103 to produce a vector (indicated at the output of complex adder 105) with an amplitude 8 times that of each element of the signal 28b and at a relative phase angle of zero ($8e^{j0}$).

Figures 7D, 7E:
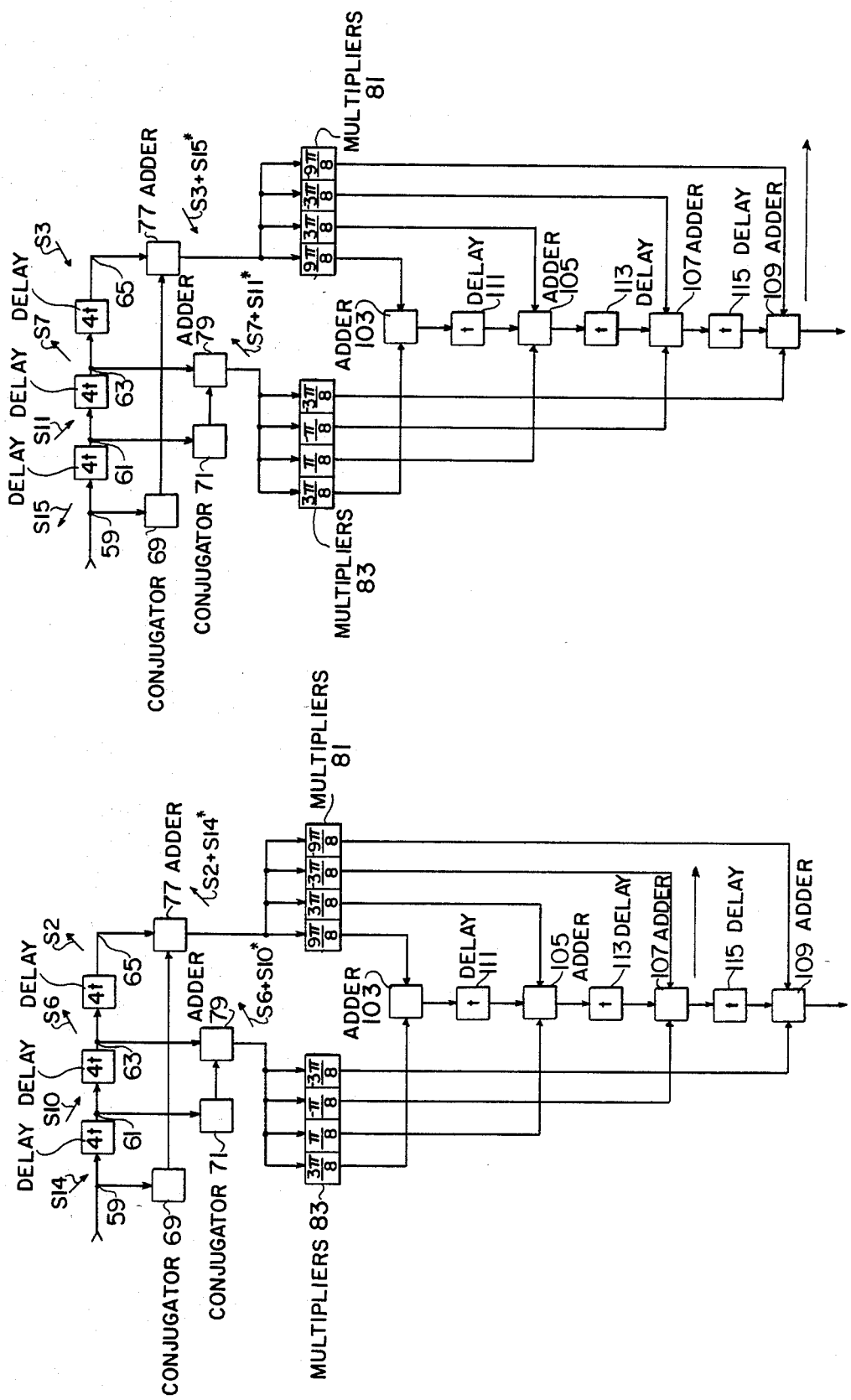

Referring to FIG. 7d, it is assumed that at the time of the particular observation, the 14th return element from reflector b has just been received. Signal elements $S_{14}$ and $S_{10}$ are conjugated in complex conjugators 69 and 71 and added in complex adders 77 and 79 to signal elements $S_2$ and $S_6$ respectively to produce two vectors with amplitudes 2 times that of each element. The outputs of complex adders 77 and 79 are applied to the two groups of complex multipliers 81 and 83, and the two complex multipliers designated $-3\pi/8$ and $-\pi/8$ produce phase shifts which are equal in magnitude but opposite in direction to the phase shifts impressed on signal elements $S_2$ and $S_6$ respectively. The outputs of the latter complex multipliers are applied to the third complex adder 107 and the sum produced by this unit is added to the time-delayed vector inputted by delay means 113 from the second complex adder 105 to produce a vector (indicated at the output of complex adder 107) with an amplitude 12 times that of each element of the signal 28b and at a relative phase angle of zero ($12e^{j0}$).

Finally, referring to FIG. 7e, it is assumed that at the time of the particular observation, the 15th return element from reflector b has just been received. Signal elements $S_{15}$ and $S_{11}$ are conjugated in complex conjugators 69 and 71 and added in complex adders 77 and 79 to signal elements $S_3$ and $S_7$ respectively to produce two vectors with amplitudes 2 times that of each element. The outputs of complex adders 77 and 79 are applied to the two groups of complex multipliers 81 and 83, and the two complex multipliers designated $-9\pi/8$ and $-3\pi/8$ produce phase shifts which are equal in magnitude but opposite in direction to the phase shifts impressed on signal elements $S_3$ and $S_7$ respectively. The outputs of the latter complex multipliers are applied to the fourth complex adder 109 and the sum produced by this unit is added to the time-delayed vector inputted by delay means 115 from the third complex adder 107 to produce a vector (indicated at the output of complex adder 109) with an amplitude 16 times that of each element of the signal 28b and at a relative phase angle of zero ($16e^{j0}$). This represents the output of the decoding unit.

The signal elements associated with reflectors a and c will be in different relative position in delay means 51 during the observation times of FIGS. 7b, 7c, 7d and 7e so that while the reflected energy from the range interval being correlated (reflector b) is enhanced, the energy values from the adjacent uncorrelated range intervals (a and c) are substantially attenuated.

While the invention has been described with reference to a particular transmitting and receiving system, in this case a radar system, it is noted that the same techniques are applicable to a variety of other signals processing systems such as sonar etc.

It is obvious that many modifications and variations of the present invention are possible in light of the above teachings. It is therefore to be understood that within the scope of the appended claims the invention may be practiced otherwise than as described.

What is claimed and desired to be secured by Letters Patent of the United States is:

1. A decoding device comprising:
    means for providing a decoding phase shift $-\Delta\phi_{k,p}$ to the signal elements of a transmitted phase-coded signal reflected from a reflector to examine a range interval corresponding to the area containing the reflector, wherein $$\Delta\phi_{k,p} = -(2\pi/N)[k-\tfrac{1}{2}(N-1)][p-\tfrac{1}{2}(N-1)]$$

is the phase of the pth code element in the kth subgroup and $k = 0, 1, 2, \ldots, N-1$ $p = 0, 1, 2, \ldots, N-1$, and N is an even integer; and means for adding the phase-shifted signal elements at the same time to produce a narrow pulse with an accompanying increase in effective peak signal.

2. The decoding device recited in claim 1 wherein the phase shift providing means includes:
    delay means having N distributed outputs including the input thereof for producing a uniform delay between adjacent ones of successive outputs corresponding to N inputted signal elements.

3. The decoding device recited in claim 2 wherein the phase shift providing means includes:
    conjugator means coupled to the first N/2 successive outputs of the delay means for producing the complex conjugate of the corresponding signal elements; and
    first signal combining means coupled to the conjugator means and to the last N/2 successive outputs of the delay means for combining pairs of outputs thereof having the same complex phase angle.

4. The decoding device recited in claim 3 wherein the phase shift providing means includes:
    multiplier means coupled to the first signal combining means for impressing a phase rotation upon each output of the first signal combining means equal in magnitude but opposite in direction to the complex phase angle thereof to decode the signal elements of the phase-coded signal.

5. The decoding device recited in claim 4 wherein the adding means includes:
    second signal combining means coupled to the multiplier means for combining the outputs thereof.

6. The decoding device recited in claim 5 wherein:

the conjugator means includes N/2 complex conjugators coupled respectively to the first N/2 successive outputs of the delay means;

the first signal combining means includes N/2 complex adders coupled respectively to the N/2 complex conjugators and to the last N/2 successive outputs of the delay means;

the multiplier means includes N/2 groups of complex multipliers coupled respectively to the N/2 complex adders, each group including N complex multipliers; and the second signal combining means includes N complex adders respectively coupled to one complex multiplier in each group, and N−1 delay means interconnecting the N complex adders for respectively introducing a delay corresponding to one inputted signal element, the output of the decoding device being taken from the last of the N complex adders.

7. The decoding device recited in claim 2 wherein:

the delay means includes $N^2-N$ stages of a shift register with output terminal every Nth stage and at the input thereof.

8. The decoding device recited in claim 2 wherein:

each sequentially inputted signal element has an inphase component and a quadrature component and the delay means includes $N^2-N$ stages of a shift register for the inphase and quadrature components respectively.

9. The decoding device recited in claim 5 wherein:

the first and second signal combining means each include separate processing channels for both the inphase and quadrature components.

10. A decoding method comprising the steps of:

providing a decoding phase shift $-\Delta\phi_{kp}$ to the signal elements of a transmitted phase-coded signal reflected from a reflector to examine a range interval corresponding to the area containing the reflector, wherein $$\Delta\phi_{k,p} = -(2\pi/N)[k-\tfrac{1}{2}(N-1)][p-\tfrac{1}{2}(N-1)]$$

is the phase of the pth code element in the kth subgroup and $k = 0, 1, 2, \ldots, N-1$ $p = 0, 1, 2, \ldots, N-1$, and N is an even integer; and adding the phase-shifted signal elements at the same time to produce a narrow pulse with an accompanying increase in effective peak signal.

* * * * *